Oct. 2, 1962 C. O. BERG 3,056,930

BLOCKING OSCILLATOR WITH OUTPUT DURING NON-CONDUCTION INTERVAL

Filed Dec. 23, 1958

INVENTOR.
CARL O. BERG

BY Fordyce A. Bothwell

ATTORNEY

United States Patent Office 3,056,930
Patented Oct. 2, 1962

3,056,930

BLOCKING OSCILLATOR WITH OUTPUT DURING NON-CONDUCTION INTERVAL

Carl O. Berg, Camden, N.J., assignor, by mesne assignments, to Philco Corporation, Philadelphia, Pa., a corporation of Delaware Filed Dec. 23, 1958, Ser. No. 782,526
3 Claims. (Cl. 331—75)

Figure 1:
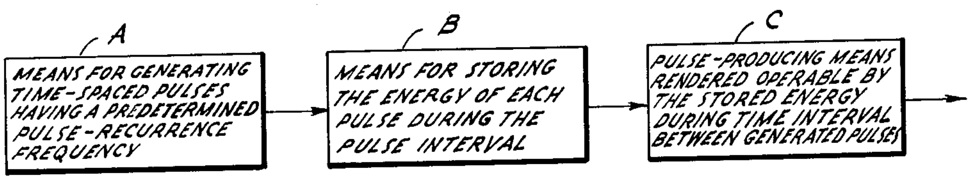

This invention relates to systems wherein it is desired to produce pulses having a predetermined pulse-recurrence frequency and a predetermined pulse width. More particularly this invention relates to pulse generating systems wherein a device such as a blocking oscillator generates pulses which are supplied to a following stage. The invention is applicable to the generation of pulses either by free-running operation of the pulse generator or by synchronization of the pulse generator by synchronizing pulses. While it is applicable generally to the generation of pulses for any purpose, the invention is particularly adapted for use in the deflection circuits of television receivers.

In the preferred embodiment of the invention, a blocking oscillator employing a transistor serves to generate pulses which are supplied to a following transistor stage. As is well known, a blocking oscillator employing a transistor comprises, in combination with the transistor, a transformer which serves to couple the base-emitter circuit to the collector-emitter circuit, and a resistance-capacitance (R-C) combination arranged to control the operation of the transistor. In operation the transistor is rendered alternately non-conductive and conductive by the charging and discharging of a capacitor. The pulse-recurrence frequency is determined mainly by the relative values of resistance and capacitance, and the pulse width is determined mainly by the characteristics of the transformer and the transistor. However, where such a device is used to supply pulses to following stages, the pulse-recurrence frequency and the pulse width are adversely affected by load variations and by replacement or change in characteristics of transistors in the following stages.

The principal object of the present invention is to provide an improved pulse-generating system wherein the pulse recurrence frequency and the pulse width are substantially unaffected by variations in the following stages.

A more specific object of the invention is to provide an improved transistorized pulse-generating system including a blocking oscillator and a following stage.

In accordance with the preferred embodiment of this invention there is provided a transistorized pulse-generating system including a blocking oscillator and a following stage, wherein the blocking oscillator is effectively isolated in respect to its operating characteristics from the following stage. More particularly, in this system the blocking oscillator produces voltage pulses of fixed pulse recurrence frequency and pulse width, and these pulses serve to control the operation of the following stage which generates voltage pulses that are non-coincident with the oscillator pulses. The preferred embodiment comprises essentially a blocking oscillator, an energy storage transformer connected to said oscillator to receive energy therefrom, and a transistor stage connected to said transformer. In operation, the transistor of the blocking oscillator is turned on intermittently to produce pulses and store energy in said transformer. During the "on" time of the blocking oscillator transistor, the transistor of the following stage is back-biased by the voltage across the secondary of said transformer and is therefore turned off. When the blocking oscillator transistor turns off, the transistor of the following stage is turned on and the energy stored in said transformer is transferred to said following stage which generates voltage pulses. Thus in this system the oscillator produces time-spaced pulses of energy which are supplied to a storage device, and during the time interval immediately following each of said pulses the stored energy is delivered to the following stage to produce pulses whose recurrence frequency is established by the oscillator independently of the following stage and whose width is determined by the following transistor and load circuit.

Figure 2:
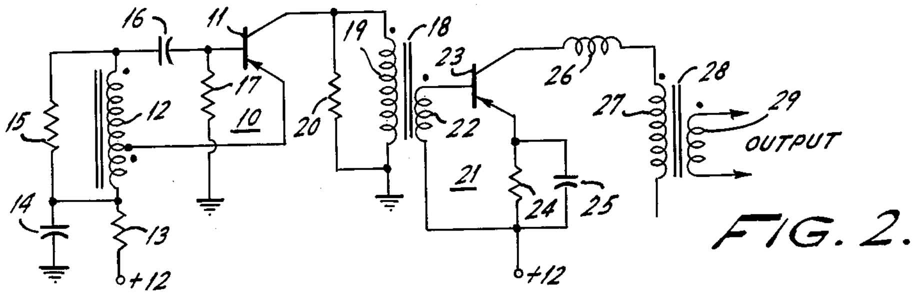
Figure 3:
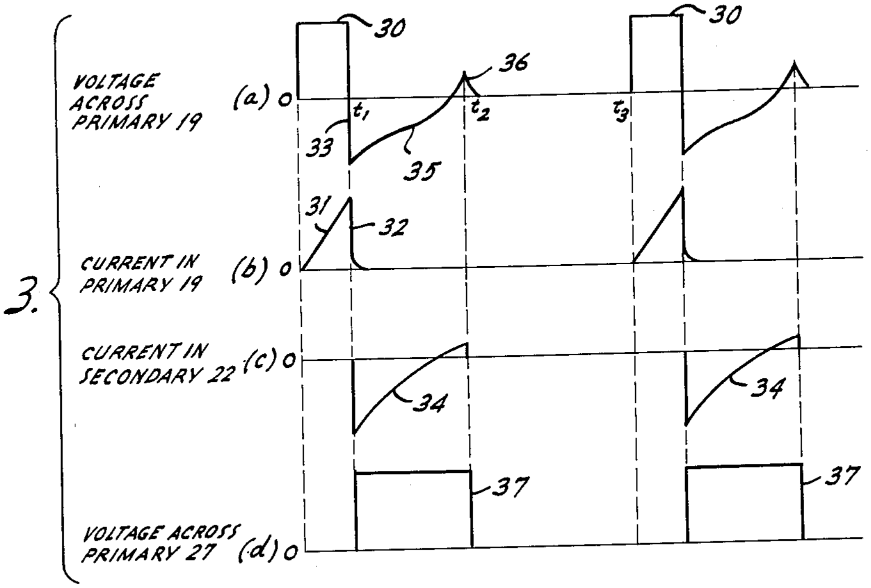
Figure 4:
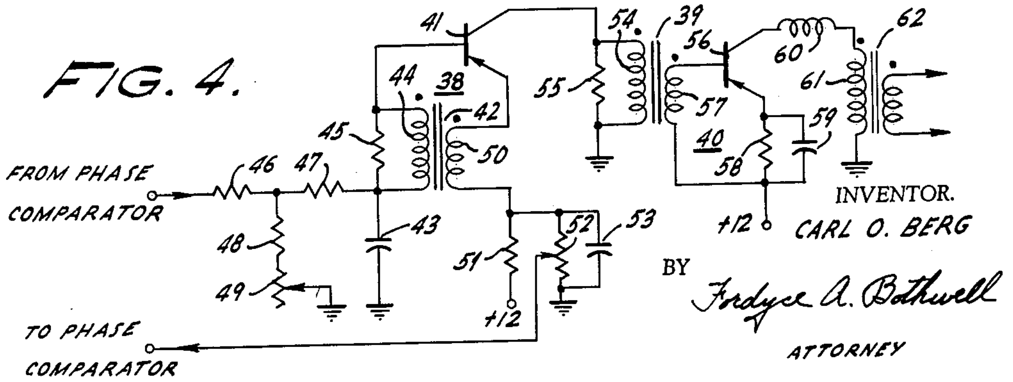

The invention may be fully understood from the following detailed description with reference to the accompanying drawing wherein FIG. 1 is a block diagram showing the broad combination of elements employed in a system according to this invention;

FIG. 2 is a schematic illustration of a pulse-generating system according to one embodiment of the invention, employing a free-running blocking oscillator;

FIG. 3 is an illustration of the principal voltages and currents produced in the system of FIG. 2, the purpose of this illustration being to facilitate an understanding of the operation of the system; and FIG. 4 is a schematic illustration of a pulse-generating system according to this invention as employed in the horizontal deflection system of a television receiver, the blocking oscillator in this instance being synchronized by the horizontal synchronizing pulses through a phase comparator.

Referring first to FIG. 1, in its broad aspect the invention provides a combination comprising essentially three components represented by blocks A, B and C. Component A serves to generate time-spaced pulses having a predetermined pulse-recurrence frequency. Component B serves to store the energy of each pulse during the pulse interval. Component C is rendered operable by the stored energy during the immediately following time interval and serves to produce pulses whose recurrence frequency is the same as that of the first pulses.

Referring now to FIG. 2, there is shown a blocking oscillator 10 comprising a transistor 11, a transformer 12 (shown as an autotransformer) which couples the base-emitter circuit to the collector-emitter circuit, a filter resistor 13 through which the collector-emitter circuit extends to the positive terminal of a d.-c. voltage source, a filter capacitor 14 connected between the upper end of resistor 13 and ground, a resistor 15 connected between capacitor 14 and the upper end of transformer 12, a capacitor 16 in the base lead of the transistor 11, and a resistor 17 connected between the transistor base and ground. As is well understood, during the operation of such an oscillator the transistor is rendered alternately non-conductive and conductive by the charging and discharging of capacitor 16.

In accordance with this invention a transformer 18, which is preferably a step-down transformer, has its primary 19 connected between the collector of transistor 11 and ground so as to be included in the collector-emitter circuit of said transistor. A resistor 20, whose purpose will be described presently, is connected in shunt with primary 19. Further in accordance with this invention a following stage 21 is connected to the secondary 22 of transformer 18 so as to be controlled by the blocking oscillator as hereinafter described. Stage 21 includes a transistor 23 whose base-emitter circuit includes the secondary 22 and a biasing resistor 24 shunted by a capacitor 25. The collector of transistor 23 is connected through an inductor 26 to the primary 27 of a transformer 28, which in turn is connected to ground. The output of stage 21 is derived from the secondary 29.

In operation the blocking oscillator 10 supplies time-spaced pulses to the transformer 18 which stores the energy of each pulse during the pulse interval. During the immediately following time interval, the stage 21 receives the stored energy and produces a pulse whose width is controlled by resistor 24 and capacitor 25 for various fixed load conditions.

The operation of the system may be clearly understood with the aid of the illustrations in FIG. 3. The illustrations (*a*) to (*d*) in this figure have the same time base commencing at a time arbitrarily chosen as zero time when transistor 11 is turned on. During the time interval 0 to $t_1$ a voltage pulse 30 appears across the primary 19 of transformer 18, and the current 31 flowing in said primary increases linearly from zero to some maximum value, storing energy in the transformer 18. During the same time interval the voltage across the secondary 22 is of such polarity as to establish a reverse bias in the base-emitter circuit of transistor 23 which is therefore turned off. Therefore during the "on" time of the blocking oscillator 10, the secondary 22 is effectively open-circuited.

At time $t_1$ transistor 11 is turned off, thus opening the circuit of primary 19 and causing the primary current to decrease very quickly to zero, as shown at 32. The resistor 20 prevents this current from going to zero instantaneously and thus prevents a large negative swing of the current due to transformer leakage inductance. At the same time, in accordance with Lenz's law the primary voltage reverses its polarity as shown at 33, and consequently the secondary voltage reverses its polarity thus turning on the transistor 23. The energy stored in transformer 18 is then delivered to the base-emitter circuit of transistor 23 and is fully dissipated before transistor 11 again turns on. The current 34 which flows in the secondary 22, i.e. the base current, is initially equal to the transformer turns ratio times the maximum primary current which was flowing just before turn-off of transistor 11. By using a step-down transformer the magnitude of the base current is increased assuring that the transistor 23 is driven on very hard. During the time interval $t_1$—$t_2$, the primary voltage decays as shown at 35 and the secondary current 34 decreases toward zero. At time $t_2$, transistor 23 is turned off by its self bias. This is because the transistor 23 is driven to collector saturation at time $t_1$ and remains in collector saturation until time $t_2$ by hole storage which is proportional to the energy stored in transformer 18 and the collector load of transistor 23. It should be noted that the base current 34 reverses direction and the current which flows into the base is hole storage current. Thus a small positive voltage spike 36 is caused to appear across the primary 19. Resistor 20 assures complete damping before the blocking oscillator is again turned on. During the time interval $t_1$—$t_2$ when transistor 23 is turned on, a voltage pulse 37 is produced across the primary 27 of transformer 28.

At time $t_3$ the oscillator transistor 11 is again turned on and the operating cycle is repeated, producing the next pulse 37. The recurrence frequency of the pulses 37 is determined by the recurrence frequency of the oscillator pulses 30, and the width of pulses 37 is proportional to the energy which is delivered by the oscillator to the following stage, the energy being determined by the width or duration of the pulses 30.

Thus the system of the present invention is novelly characterized in that the oscillator stage 10 during each "on" time stores a certain amount of energy in the storage transformer 18 while the secondary 22 is open-circuited, and during the following "off" time of the oscillator the stored energy is delivered to the following stage 21 to produce one of the pulses 37. In this system the recurrence frequency of the generated pulses 37 is determined solely by the parameters of the oscillator stage and is not affected by variations in the parameters of the following stage. The output of the oscillator is taken at times when the oscillator transistor itself is out of conduction, and is taken from a portion of the system which is isolated from the repetition rate determining elements of the system. With this system it is possible to change transistors or transistor types in the stage or stages following the oscillator without affecting the frequency of the oscillator pulses.

The recurrence frequency and width of the pulses produced by the oscillator are determined by the discharge time constant of the rate-determining capacitor and its discharge resistance, the oscillator transformer inductance, the coupling capacitance, the secondary shunt resistance, and the magnetizing inductance of the primary of the storage transformer. All of these parameters are easily fixed since they involve controllable passive circuit elements. By properly choosing these parameters, the operating frequency can be made practically independent of beta variations.

An important novel feature of this system is the subcombination arrangement of the blocking oscillator and its output transformer. In prior blocking oscillators, the output is derived from the blocking oscillator transformer. However in this system the output of the blocking oscillator is derived independently of the oscillator transformer through a second transformer whose primary is serially included in the collector-emitter circuit.

Referring now to FIG. 4, there is shown a system according to the present invention as employed in the horizontal deflection system of a television receiver to drive the output stage. As in the system of FIG. 2, the system of FIG. 4 comprises a blocking oscillator 38, a storage transformer 39, and a following stage 40, the operation being substantially the same as described above with reference to FIG. 2. In the system of FIG. 4, however, the blocking oscillator 38 is synchronized by the output of a phase comparator (not shown) which compares the phase of the fly back pulses with the phase of the incoming synchronizing pulses, as well understood in the art. The blocking oscillator 38 includes a transistor 41 and a transformer 42 which couples the base-emitter circuit to the collector-emitter circuit. The transistor is rendered alternately non-conductive and conductive by the charging and discharging of capacitor 43 which is included in the base-emitter circuit along with the shunt-connected secondary 44 and resistor 45.

The output of the phase comparator is supplied to the oscillator through resistors 46 and 47. Resistors 48 and 49 are provided for the purpose of horizontal hold control.

The primary 50 of transformer 42 is connected to the emitter of transistor 41 and to a resistor 51 which is connected to the positive terminal of a source of D.-C. voltage supply. A potentiometer 52, which is connected to the upper end of resistor 51 and is shunted by capacitor 53, serves to supply the necessary D.-C. reference voltage for the phase comparator.

As in the system of FIG. 2, the primary 54 of the storage transformer 39 is shunted by resistor 55 for the purpose hereinbefore described with reference to FIG. 2.

Also as in the system of FIG. 2, the following stage 40 comprises a transistor 56 whose base-emitter circuit includes the secondary 57 and the biasing resistor 58 shunted by capacitor 59, and whose collector-emitter circuit, in addition to including the biasing resistor 58, includes an inductor 60 and the primary 61 of output transformer 62.

In operation as in the case of FIG. 2, the blocking oscillator 38 during the "on" times of the transistor 41 stores energy in the storage transformer 39 whose secondary 57 is then open-circuited by reason of the reverse biasing of transistor 56; and during the "off" times of transistor 41 the stored energy is delivered to the base-emitter circuit of transistor 56, producing pulses whose recurrence frequency is determined solely by the parameters of the blocking oscillator and whose width is determined by both the energy stored in transformer 39 and the parameters of stage 40.

While certain embodiments of the invention have been illustrated and described, it is to be understood that the invention is not limited thereto but contemplates such modifications and further embodiments as may occur to those skilled in the art.

I claim:

1. A pulse generating system comprising: a blocking oscillator including a transistor and a transformer coupling the base-emitter and collector-emitter circuits of the transistor which is rendered alternately conductive and non-conductive; an energy-storage transformer having a primary winding and a secondary winding; means connecting said primary winding in the collector-emitter circuit of said transistor in series with a winding of the first-mentioned transformer, whereby voltage pulses are produced across said primary winding during the time intervals of conduction of said transistor, and during each of said intervals current flows in said primary winding storing energy in the transformer and producing across said secondary winding a unidirectional voltage of certain polarity; an output pulse-producing stage including a transistor; means connecting the base and the emitter of said last-mentioned transistor to said secondary winding in such polarity relation that said unidirectional voltage renders said last-mentioned transistor non-conductive during each of said intervals, whereby reversal of polarity of the voltage across said secondary winding when said first-mentioned transistor is rendered non-conductive renders said last-mentioned transistor conductive to produce pulses during the time intervals of non-conduction of said first-mentioned transistor; and means for deriving the last-mentioned pulses from said output stage.

2. A pulse generating system according to claim 1, wherein said oscillator is a free-running oscillator.

3. A pulse generating system according to claim 1, wherein said oscillator is synchronized by an input voltage.

References Cited in the file of this patent

UNITED STATES PATENTS

| | | |
|---|---|---|
| 2,605,424 | Janvrin | July 29, 1952 |
| 2,764,643 | Sulzer | Sept. 25, 1956 |
| 2,791,739 | Light | May 7, 1957 |
| 2,854,614 | Light | Sept. 30, 1958 |
| 2,886,764 | Zelina | May 12, 1959 |

OTHER REFERENCES

"Waveforms" by Chance et al. 1st edition 1949, published by McGraw-Hill Book Co., New York, pages 250–251.